(12) United States Patent
Yaguchi et al.

(10) Patent No.: US 8,562,855 B2
(45) Date of Patent: Oct. 22, 2013

(54) SILICON ETCHING LIQUID AND ETCHING METHOD

(75) Inventors: Kazuyoshi Yaguchi, Tokyo (JP); Ryuji Sotoaka, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 344 days.

(21) Appl. No.: 12/991,510

(22) PCT Filed: Apr. 24, 2009

(86) PCT No.: PCT/JP2009/058164
§ 371 (c)(1),
(2), (4) Date: Nov. 9, 2010

(87) PCT Pub. No.: WO2009/136558
PCT Pub. Date: Nov. 12, 2009

(65) Prior Publication Data
US 2011/0059619 A1    Mar. 10, 2011

(30) Foreign Application Priority Data

May 9, 2008    (JP) ................................. 2008-122942

(51) Int. Cl.
*H01L 21/306*    (2006.01)

(52) U.S. Cl.
USPC ....... 252/79.5; 252/79.1; 252/79.2; 252/79.3; 252/79.4; 438/745; 438/753; 438/689; 257/E21.223; 216/83; 216/90; 216/91; 216/96; 216/99

(58) Field of Classification Search
USPC ............ 438/689–693, 745–757; 216/83–109; 252/79.1–79.5; 257/E21.223
See application file for complete search history.

(56) References Cited

U.S. PATENT DOCUMENTS

2005/0261632 A1*  11/2005  Xu ................................ 604/173
2010/0248495 A1    9/2010  Yaguchi et al.

FOREIGN PATENT DOCUMENTS

| JP | 2006-40925 | | 2/2006 |
| JP | 2006040925 | A * | 2/2006 |
| JP | 2006 351813 | | 12/2006 |
| JP | 2007 214456 | | 8/2007 |
| JP | 2008071799 | A * | 3/2008 |

OTHER PUBLICATIONS

Schnakenberg et al., Solid-State Sensors and Actuators, Digest of Technical Papers 1991 International Conference on Transducers, pp. 815-818.*
Office Action issued Jan. 5, 2012 in Chinese Patent Application No. 200980116681.5.
U.S. Appl. No. 13/508,475, filed May 7, 2012, Sotoaka, et al.

* cited by examiner

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

In etching processing of silicon, in particular anisotropic etching processing of silicon in a manufacturing step of MEMS parts, an etching liquid having a long life of etching liquid and an etching method are provided by suppressing a lowering of an etching rate at the time of warming which is characteristic of a hydroxylamine-containing etching liquid. A silicon etching liquid which is an alkaline aqueous solution containing an alkali metal hydroxide, hydroxylamine and an inorganic carbonate compound and having a pH of 12 or more and which is able to anisotropically dissolve monocrystalline silicon therein, and an etching method of silicon using this etching liquid are provided.

18 Claims, No Drawings

US 8,562,855 B2

SILICON ETCHING LIQUID AND ETCHING METHOD

TECHNICAL FIELD

The present invention relates to etching processing of silicon. In particular, the present invention relates to a silicon etching liquid and a silicon etching method to be used for manufacturing parts or semiconductor devices which are used for MEMS (Micro-Electro-Mechanical System), so-called micromachines.

BACKGROUND ART

In general, in the case where a silicon single crystal substrate is etched with a chemical solution, there is carried out a method of performing etching with an acid based etching liquid which is a mixed aqueous solution having components such as hydrofluoric acid and nitric acid, etc. added thereto; or a method of performing etching with an alkali based etching liquid which is an aqueous solution of potassium hydroxide (KOH), tetramethylammonium hydroxide (TMAH), etc. (see Non-Patent Documents 1 and 2).

In the case where an acid based etching liquid is used, the surface of silicon is oxidized with a component having an oxidizing action, such as nitric acid, etc., to form silicon oxide, and this silicon oxide is dissolved as silicon fluoride by hydrofluoric acid, etc., whereby etching proceeds. A characteristic feature in performing etching with an acid based etching liquid resides in the fact that even when silicon which is an etching object is monocrystalline, polycrystalline or amorphous, the etching isotropically proceeds. For that reason, in performing pattern etching using a pattern mask, etc., there may be the case where the deeper the etching, the more the etching in a lateral direction, namely undercut (erosion) beneath the pattern mask proceeds to the same degree as the depth, resulting in causing inconvenience.

On the other hand, in the case where an alkali based etching liquid is used, silicon is dissolved as a silicate ion by a hydroxy anion in the liquid, and on that occasion, water is reduced to generate hydrogen. When etching with the alkali based etching liquid is performed, different from the case of the acid based etching liquid, etching of monocrystalline silicon proceeds while keeping anisotropy. This is based on the fact that there is a difference in a dissolution rate of silicon in every crystal face orientation of silicon, and this etching is also called crystal anisotropic etching. Even in polycrystalline silicon, etching proceeds while keeping anisotropy on microscopic observations. However, in view of the fact that the face orientation of crystal grains is randomly distributed, isotropic etching appears to proceed on macroscopic observations. In amorphous silicon, etching isotropically proceeds on both of microscopic observations and macroscopic observations.

As the alkali based etching liquid, besides the aqueous solution of KOH or TMAH, an aqueous solution of sodium hydroxide (NaOH), ammonia, hydrazine, etc. is used. In etching processing of a monocrystalline silicon substrate using such an aqueous solution, in many cases, a long processing time as from several hours to several tens hours is required though it varies depending upon the desired processing shape or temperature conditions upon which the treatment is carried out, or the like.

For the purpose of shortening this processing time even a little, there is developed a chemical liquid exhibiting a high etching rate. For example, Patent Document 1 discloses a technology in which an aqueous solution obtained by adding a hydroxylamine in TMAH is used as an etching liquid. Also, Patent Document 2 discloses a technology in which an aqueous solution obtained by adding a specified compound such as iron, iron(III)chloride, iron(II)hydroxide, etc. in TMAH is used as an etching liquid and discloses that so far as a degree of the effect for increasing an etching rate is concerned, a combination of joint use of iron and hydroxylamine is especially suitable. Also, Patent Document 3 discloses a technology in which an aqueous solution obtained by adding a hydroxylamine in KOH is used as an etching liquid.

[Patent Document 1] JP-A-2006-054363
[Patent Document 2] JP-A-2006-186329
[Patent Document 3] JP-A-2006-351813
[Non-Patent Document 1] Sato, "Silicon Etching Technologies", Surface Technology, in *Journal of the Surface Finishing Society of Japan*, Aug. 1, 2000, Vol. 51, No. 8, 2000, pages 754 to 759
[Non-Patent Document 2] Esashi, "2003 *MICROMACHINE/MEMS Technology Outlook*", Electronic Journal Co., Ltd., Jul. 25, 2003, pages 109 to 114

DISCLOSURE OF THE INVENTION

Problems that the Invention is to Solve

However, in view of the fact that the hydroxylamine which is added for the purpose of accelerating the etching rate in the technologies disclosed in the foregoing Patent Documents 1, 2 and 3 is a self-decomposing compound, a lowering of concentration to be caused due to denaturation during the storage at room temperature is easy to occur, and in the case where the etching liquid per se is kept in a warmed state, the lowering of concentration becomes much more conspicuous. Since this lowering of concentration of the hydroxylamine causes a lowering of the etching rate, when kept in a warmed state, the etching rate is lowered with a lapse of time. For that reason, in the case of performing etching processing so as to form deep pores using a hydroxylamine-containing etching liquid, a complicated operation of repeated confirmation to what extent of depth the etching processing proceeds was needed.

Then, an object of the present invention is to provide a silicon etching liquid capable of anisotropically dissolving monocrystalline silicon therein while depressing a lowering of an etching rate with a lapse of time by suppressing the decomposition of hydroxylamine without impairing a strong point of a hydroxylamine-containing alkaline aqueous solution such that the etching rate is high and a silicon etching method.

Means for Solving the Problems

In order to solve the foregoing problems, the present inventors made extensive and intensive investigations. As a result, it has been found that by performing etching with an alkaline aqueous solution containing an alkali metal hydroxide, hydroxylamine and an inorganic carbonate compound and having a pH of 12 or more, a lowering of the etching rate to be caused due to the decomposition of hydroxylamine without impairing a strong point such that the etching rate against silicon is high, leading to accomplishment of the present invention.

That is, the present invention is concerned with a silicon etching liquid and an etching method. The present invention is as follows.

1. A silicon etching liquid for anisotropically dissolving monocrystalline silicon therein, which is an alkaline aqueous solution containing (A) an alkali metal hydroxide, (B)

hydroxylamine and (C) an inorganic carbonate compound and having a pH of 12 or more.

2. The silicon etching liquid as set forth in the foregoing item 1, wherein the alkali metal hydroxide (A) is potassium hydroxide and/or sodium hydroxide.

3. The silicon etching liquid as set forth in the foregoing item 1, wherein the inorganic carbonate compound (C) is a compound capable of being dissociated in the alkaline aqueous solution to generate a carbonate ion ($CO_3^{2-}$).

4. The silicon etching liquid as set forth in the foregoing item 1, wherein a concentration of an alkali metal ion generated in the aqueous solution upon dissociation of the alkali metal hydroxide (A) and the inorganic carbonate compound (C) is from 3.0 moles/kg to 4.5 moles/kg; and a concentration of a carbonate ion ($CO_3^{2-}$) generated in the aqueous solution upon dissociation of the inorganic carbonate compound (C) is from 0.28 to 0.42 in terms of a molar ratio to the concentration of the alkali metal ion.

5. The silicon etching liquid as set forth in the foregoing item 1, wherein the inorganic carbonate compound (C) is one or more members selected among carbon dioxide ($CO_2$), potassium carbonate ($K_2CO_3$), potassium hydrogencarbonate ($KHCO_3$), sodium carbonate ($Na_2CO_3$) and sodium hydrogencarbonate ($NaHCO_3$).

6. The silicon etching liquid as set forth in the foregoing item 4, wherein the alkali metal ion is a potassium ion ($K^+$) and/or a sodium ion ($Na^+$).

7. The silicon etching liquid as set forth in any one of the foregoing items 1 to 6, having a pH of 13 or more.

8. A silicon etching method including a step of bringing an etching object into contact with a silicon etching liquid, wherein the silicon etching liquid is a liquid for anisotropically dissolving monocrystalline silicon therein and is an alkaline aqueous solution containing (A) an alkali metal hydroxide, (B) hydroxylamine and (C) an inorganic carbonate compound and having a pH of 12 or more.

9. The silicon etching method as set forth in the foregoing item 8, wherein the alkali metal hydroxide (A) is potassium hydroxide or sodium hydroxide; and the inorganic carbonate compound (C) is one or more members selected among carbon dioxide ($CO_2$), potassium carbonate ($K_2CO_3$), potassium hydrogencarbonate ($KHCO_3$), sodium carbonate ($Na_2CO_3$) and sodium hydrogencarbonate ($NaHCO_3$).

Advantages of the Invention

According to the invention of the present application, it is possible to provide a silicon etching liquid for anisotropically dissolving monocrystalline silicon therein in which while keeping a high etching rate as a strong point of the hydroxylamine-containing alkaline aqueous solution, not only the decomposition of hydroxylamine can be suppressed, but a lowering of the etching rate can be suppressed and a silicon etching method. In consequence, complicated operations such as frequent processing shape confirmation in realizing a long life of the hydroxylamine-containing silicon etching liquid and performing an etching treatment, and the like can be greatly simplified.

BEST MODES FOR CARRYING OUT THE INVENTION

[Silicon Etching Liquid]

The silicon etching liquid of the present invention is an alkaline aqueous solution containing (A) an alkali metal hydroxide, (B) hydroxylamine and (C) an inorganic carbonate compound and having a pH of 12 or more and is a silicon etching liquid for anisotropically dissolving monocrystalline silicon therein. First of all, each composition of the silicon etching liquid of the present invention is described.

<<(A) Alkali Metal Hydroxide>>

The alkali metal hydroxide which is used in the present invention is preferably potassium hydroxide and/or sodium hydroxide, and especially preferably potassium hydroxide. The alkaline compound according to the present invention may be used singly or in combinations.

The alkali metal hydroxide which is used in the present invention is dissociated into an alkali metal ion and a hydroxide ion in water. The alkali metal ion generated upon dissociation is specifically a potassium ion ($K^+$) or a sodium ion ($Na^+$).

<<(C) Inorganic Carbonate Compound>>

The inorganic carbonate compound which is used in the present invention is a compound capable of generating a carbonate ion ($CO_3^{2-}$) upon being dissociated in water, and preferably carbon dioxide ($CO_2$), potassium carbonate ($K_2CO_3$), potassium hydrogencarbonate ($KHCO_3$), sodium carbonate ($Na_2CO_3$) or sodium hydrogencarbonate ($NaHCO_3$). The inorganic carbonate compound according to the present invention may be used singly or in combinations.

Of the inorganic carbonate compounds which are used in the present invention, each of potassium carbonate ($K_2CO_3$) and potassium hydrogencarbonate ($KHCO_3$) generates a carbonate ion ($CO_3^{2-}$) and simultaneously generates a potassium ion ($K^+$) upon being dissociated in water. Each of sodium carbonate ($Na_2CO_3$) and sodium hydrogencarbonate ($NaHCO_3$) generates a carbonate ion ($CO_3^{2-}$) and simultaneously generates a sodium ion ($Na^+$) upon being dissociated in water.

<<pH of Etching Liquid>>

The etching liquid of the present invention is required to have a pH of 12 or more. This is because when the pH is lower than 12, since a part of the carbonate ion in the etching liquid abruptly changes into a bicarbonate ion, the etching rate is extremely lowered in a state where the bicarbonate ion is present. For that reason, the etching liquid of the present invention is required to be regulated to have a pH at 12 or more, and preferably 13 or more such that the bicarbonate ion is not generated. When the pH of the etching liquid of the present invention is 12 or more, a change of the carbonate ion in the etching liquid into a bicarbonate ion does not substantially occur, and the carbonate ion is stably present in the etching liquid, and thus, it becomes possible to suppress a lowering of the etching rate.

<<Alkali Metal Ion Concentration and Carbonate Ion Concentration>>

The silicon etching liquid of the present invention is preferably used in the range where a total sum of the alkali metal ion concentration in the liquid is from 3.0 to 4.5 moles/kg. Furthermore, the silicon etching liquid of the present invention is preferably used in the range where a carbonate ion concentration is from 0.28 to 0.42 in terms of a molar ratio to this total sum of the alkali metal ion concentration. Here, the metal ion concentration as referred to in the present invention means a concentration of the metal ion to the silicon etching liquid.

In particular, in the case where potassium hydrogencarbonate ($KHCO_3$) or sodium hydrogencarbonate ($NaHCO_3$) is used as a compound capable of generating a carbonate ion, it is preferable that in order to regulate the pH at 12 or more, an alkali metal hydroxide is added in an amount exceeding a molar number of such an inorganic carbonate compound to change all of bicarbonate ions generated on the way of the preparation of the etching liquid into a carbonate ion, thereby regulating the carbonate ion concentration in the range of from 0.28 to 0.42 in terms of a molar ratio to the alkali metal ion.

When the total sum of the alkali metal ion concentration is 3.0 moles/kg or more, an effect for enhancing the etching rate with hydroxylamine is sufficiently obtained. Also, when it is not more than 4.5 moles/kg, the concentration of the inorganic carbonate compound necessary for suppressing the decomposition of hydroxylamine becomes low, and the total concentration of dissolved components in the etching liquid becomes low; and thus, a silicate is not deposited by dissolution of a relatively small amount of silicon, and handling is easy.

Also, when the carbonate ion concentration is 0.28 or more in terms of a molar ratio to the alkali metal ion concentration, an effect for suppressing the decomposition of hydroxylamine is sufficiently obtained, and thus, it is easy to suppress a lowering of the etching rate. Also, when it is not more than 0.42 in terms of a molar ratio, a lowering of the etching rate following a lowering of the pH hardly occurs, and hence, such is preferable. Also, for the same reason, this molar ratio is more preferably in the range of from 0.35 to 0.42.

On the assumption that the alkali metal hydroxide and the inorganic carbonate compound added in the aqueous solution are present in the aqueous solution upon being completely dissociated, the alkali metal ion concentration and the carbonate ion concentration in the present invention are calculated values determined according to the calculation from the addition amounts of such alkali metal hydroxide and inorganic carbonate compound in the liquid. This assumption replies on the fact that as described previously, so far as the silicon etching liquid is an alkaline aqueous solution having a pH of 12 or more, the alkali metal hydroxide and the inorganic carbonate compound are completely dissociated in the etching liquid and converted into an alkali metal ion and a carbonate ion, respectively. That is, so far as the pH of the silicon etching liquid is 12 or more, the actual alkali metal ion concentration and carbonate ion concentration in the etching liquid can be equated with the foregoing calculated values.

<<(B) Hydroxylamine>>

A concentration of hydroxylamine which is used in the present invention can be properly determined depending upon a desired silicon etching rate, and hydroxylamine is preferably used in a concentration in the range of from 1 to 11% by weight relative to the silicon etching liquid. When the concentration of hydroxylamine is less than 1% by weight, there may be the case where the effect for enhancing the silicon etching rate due to the addition of hydroxylamine is not distinctly obtained. When it is 1% by weight or more, the effect for enhancing the etching rate due to the addition of hydroxylamine is distinctly obtained. In increasing the hydroxylamine concentration, there is found a tendency that following this, the etching rate monotonously increases, too. However, even by increasing the concentration of hydroxylamine exceeding 11% by weight, an effect for further enhancing the etching rate is not found so much. The hydroxylamine concentration may be properly determined while taking into consideration a desired etching rate.

[Silicon Etching Method]

The silicon etching method of the present invention includes a step of bringing the silicon etching liquid of the present invention into contact with an etching object. A method for bringing the silicon etching liquid into contact with the etching object is not particularly limited, and for example, a method for bringing the silicon etching liquid into contact with the object by a mode such as dropwise addition (single-wafer spin processing), spraying, etc., a method for immersing the object in the silicon etching liquid and the like can be adopted. In the present invention, a method for bringing the silicon etching liquid into contact with the object by dropwise addition (single-wafer spin processing) or a method for bringing the object into contact with the silicon etching liquid upon being immersed is preferably adopted.

More specifically, a method including a contact step of immersing the object in the warmed etching liquid or bringing the etching liquid into contact with the object, a rinse step of after a lapse of a prescribed time, taking out the object and rinsing off the etching liquid attached to the object by water, etc and after that a drying step of subsequently drying the attached water is preferably adopted as the silicon etching method of the present invention.

A use temperature of the etching liquid is preferably a temperature of 40° C. or higher and lower than a boiling point thereof, more preferably from 50° C. to 90° C., and especially preferably from 70° C. to 90° C. So far as the temperature of the etching liquid is 40° C. or higher, the etching rate does not become excessively low so that the production efficiency is not remarkably lowered. On the other hand, so far as the temperature is lower than the boiling point, a change of the liquid composition is suppressed so that the etching condition can be kept on a fixed level. By making the temperature of the etching liquid high, the etching rate increases. However, taking into consideration suppression of a change of the composition of the etching liquid on a small level or the like, an optimal treatment temperature may be properly determined.

The object of the etching treatment in the present invention is a monocrystalline silicon-containing substrate or polyhedral block, and the monocrystalline silicon is present in an entire region or partial region of the substrate or block. In this respect, the monocrystalline silicon may be of a single layer or laminated in a multi-layered state. A material obtained by subjecting an entire region or partial region of such a substrate or block to ion doping is also the object of the etching treatment. Also, those in which a material such as a silicon oxide film, a silicon nitride film, a silicon organic film, etc. or a metal film such as an aluminum film, a chromium film, a gold film, etc. is present on the surface of the foregoing etching object or in the inside of the object are included in the object of the etching treatment in the present invention.

EXAMPLES

The present invention is more specifically described below with reference to the following Examples and Comparative Examples, but it should be construed that the present invention is not limited to these Examples at all. The etching object used for the evaluation is a monocrystalline silicon (100) (hereinafter sometimes simply referred to as "silicon (100)") wafer. The surface on one side of this silicon (100) wafer is in a state where its entire surface is covered by a protective film made of a silicon thermal oxide film; and the surface on the other side has a pattern shape in which a part of a silicon thermal oxide film is removed by dry etching, whereby the silicon surface is exposed. This silicon (100) wafer was immersed in a 1% hydrofluoric acid aqueous solution at 23° C. for 7 minutes just before an etching treatment and then rinsed with ultra-pure water, followed by drying. A silicon natural oxide film formed on the surface of a portion where the silicon surface in a pattern shape was exposed was removed by this treatment with a hydrofluoric acid aqueous solution, and thereafter, the etching treatment was carried out.

Etching Treatment Method of Monocrystalline Silicon (100) Wafer and Calculation Method of Etching Rate Each of etching liquids shown in the following Examples and Comparative Examples was charged in a container made of PTFE (polytetrafluoroethylene), and this container was dipped in a water bath, and the temperature of the etching liquid was increased to 80° C. After the temperature of the etching liquid reached 80° C., a monocrystalline silicon (100) wafer was subjected to an etching treatment upon being dipped in the etching liquid for 10 minutes; and thereafter, the wafer was taken out, rinsed with ultra-pure water and then dried. In the wafer having been subjected to an etching treatment, following the etching of silicon, the pattern portion became in a hollow state as compared with the surroundings thereof, and a difference of elevation between the etched portion and the non-etched portion was measured, thereby determining an etching depth of the silicon (100) face for 10 minutes. A value obtained by dividing this etching depth by 10 was calculated as an etching rate (unit: μm/min) of the silicon (100) face.

Heat Aging Test Method and Lowering Ratio of Etching Rate

A heat aging test was carried out according to the following method. That is, after measuring an etching rate ($V_1$) of the silicon (100) face at an etching temperature of 80° C., this temperature of the etching liquid was raised to 85° C.; the warmed state of 85° C. was continued for 24 hours; thereafter, the liquid temperature was returned to 80° C.; and an etching rate ($V_2$) of the silicon (100) face at 80° C. was again measured. The etching rate before and after this heat aging treatment was compared, and a value obtaining by dividing a difference in the etching rate before and after the heat aging treatment ($V_1-V_2$) by the etching rate ($V_1$) before the heat aging treatment, followed by multiplying by 100 was calculated as a lowering ratio of etching rate (expression 1)

$$\text{Lowering ratio of etching rate}(\%) = [(V_1-V_2)/(V_1)] \times 100 \quad (1)$$

The heat aging treatment performed in each of Examples 1 to 15 and Comparative Examples 1 to 6 is merely an example of the treatment performed for the purpose of evaluating the stability of the etching liquid. Needless to say, the higher the heating temperature or the longer the heating time, the more the decomposition of hydroxylamine proceeds, whereby the lowering of the etching rate becomes conspicuous; and the lower the heating temperature or the shorter the heating time, the more the lowering of the etching rate is reduced. This test is aimed to relatively compare a degree of the lowering of the etching rate of the silicon (100) face among the respective liquid compositions, and the lowering ratio of the etching rate itself does not exhibit absolute stability of the etching liquid.

pH Measurement

The pH measurement was carried out at 23° C. using a pH meter (Model: F-12), manufactured by Horiba, Ltd. Examples 1 to 15, Comparative Examples 1 to 4 and Comparative Example 6 exhibited a pH value of 14 or more.

Example 1

149.3 g of a 48% potassium hydroxide (KOH) aqueous solution (containing KOH in an amount corresponding to 1.28 moles therein), 132.5 g of a potassium carbonate ($K_2CO_3$) powder (corresponding to 0.96 moles of $K_2CO_3$), 500.0 g of a 20% by weight hydroxylamine (HA) aqueous solution and 218.2 g of water were mixed to prepare 1,000 g of an etching liquid. A potassium ion concentration and a carbonate ion concentration in this etching liquid are calculated to be 3.2 moles/kg and 0.96 moles/kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.0 μm/min, $V_2$ was 3.4 μm/min, and a lowering ratio of the etching rate was 15.0%.

Example 2

168.0 g of a 48% KOH aqueous solution (containing KOH in an amount corresponding to 1.44 moles therein), 149.0 g of a $K_2CO_3$ powder (corresponding to 1.08 moles of $K_2CO_3$), 500.0 g of a 20% by weight HA aqueous solution and 183.0 g of water were mixed to prepare 1,000 g of an etching liquid. A potassium ion concentration and a carbonate ion concentration in this etching liquid are calculated to be 3.6 moles/kg and 1.08 moles/kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.1 μm/min, $V_2$ was 3.5 μm/min, and a lowering ratio of the etching rate was 14.6%.

Example 3

182.0 g of a 48% KOH aqueous solution (containing KOH in an amount corresponding to 1.56 moles therein), 161.5 g of a $K_2CO_3$ powder (corresponding to 1.17 moles of $K_2CO_3$), 500.0 g of a 20% by weight HA aqueous solution and 156.5 g of water were mixed to prepare 1,000 g of an etching liquid. A potassium ion concentration and a carbonate ion concentration in this etching liquid are calculated to be 3.9 moles/kg and 1.17 moles/kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.5 μm/min, $V_2$ was 3.7 μm/min, and a lowering ratio of the etching rate was 17.8%.

Example 4

200.7 g of a 48% KOH aqueous solution (containing KOH in an amount corresponding to 1.72 moles therein), 178.0 g of a $K_2CO_3$ powder (corresponding to 1.29 moles of $K_2CO_3$), 500.0 g of a 20% by weight HA aqueous solution and 121.3 g of water were mixed to prepare 1,000 g of an etching liquid. A potassium ion concentration and a carbonate ion concentration in this etching liquid are calculated to be 4.3 moles/kg and 1.29 moles/kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.8 μm/min, $V_2$ was 3.9 μm/min, and a lowering ratio of the etching rate was 18.8%.

Comparative Example 1

373.3 g of a 48% KOH aqueous solution (containing KOH in an amount corresponding to 3.2 moles therein), 500.0 g of a 20% by weight HA aqueous solution and 126.7 g of water were mixed to prepare 1,000 g of an etching liquid. A potassium ion concentration in this etching liquid is calculated to be 3.2 moles/kg; and a carbonate ion is not contained, and therefore, a molar ratio of the carbonate ion concentration to the potassium ion concentration is 0.0. An HA concentration in this etching liquid is 10% by weight, and a pH of this etching liquid is 14 or more.

A heat aging test was carried out using this etching liquid. As a result, $V_1$ was 3.6 μm/min, $V_2$ was 2.8 μm/min, and a lowering ratio of the etching rate was 22.2%.

Comparative Example 2

420.0 g of a 48% KOH aqueous solution (containing KOH in an amount corresponding to 3.6 moles therein), 500.0 g of a 20% by weight HA aqueous solution and 80.0 g of water were mixed to prepare 1,000 g of an etching liquid. A potassium ion concentration in this etching liquid is calculated to be 3.6 moles/kg; and a carbonate ion is not contained, and therefore, a molar ratio of the carbonate ion concentration to the potassium ion concentration is 0.0. An HA concentration in this etching liquid is 10% by weight, and a pH of this etching liquid is 14 or more.

A heat aging test was carried out using this etching liquid. As a result, $V_1$ was 3.9 μm/min, $V_2$ was 3.0 μm/min, and a lowering ratio of the etching rate was 23.1%.

Comparative Example 3

455.0 g of a 48% KOH aqueous solution (containing KOH in an amount corresponding to 3.9 moles therein), 500.0 g of a 20% by weight HA aqueous solution and 45.0 g of water were mixed to prepare 1,000 g of an etching liquid. A potassium ion concentration in this etching liquid is calculated to be 3.9 moles/kg; and a carbonate ion is not contained, and therefore, a molar ratio of the carbonate ion concentration to the potassium ion concentration is 0.0. An HA concentration in this etching liquid is 10% by weight, and a pH of this etching liquid is 14 or more.

A heat aging test was carried out using this etching liquid. As a result, $V_1$ was 4.3 μm/min, $V_2$ was 3.1 μm/min, and a lowering ratio of the etching rate was 27.9%.

Comparative Example 4

501.7 g of a 48% KOH aqueous solution (containing KOH in an amount corresponding to 4.3 moles therein), 400.0 g of a 25% by weight HA aqueous solution and 98.3 g of water were mixed to prepare 1,000 g of an etching liquid. A potassium ion concentration in this etching liquid is calculated to be 4.3 moles/kg; and a carbonate ion is not contained, and therefore, a molar ratio of the carbonate ion concentration to the potassium ion concentration is 0.0. An HA concentration in this etching liquid is 10% by weight, and a pH of this etching liquid is 14 or more.

A heat aging test was carried out using this etching liquid. As a result, $V_1$ was 4.4 μm/min, $V_2$ was 3.2 μm/min, and a lowering ratio of the etching rate was 27.3%.

Example 5

74.7 g of a 48% KOH aqueous solution (containing KOH in an amount corresponding to 0.64 moles therein), 176.6 g of a $K_2CO_3$ powder (corresponding to 1.28 moles of $K_2CO_3$), 500.0 g of a 20% by weight HA aqueous solution and 248.7 g of water were mixed to prepare 1,000 g of an etching liquid. A potassium ion concentration and a carbonate ion concentration in this etching liquid are calculated to be 3.2 moles/kg and 1.28 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.3 μm/min, $V_2$ was 3.2 μm/min, and a lowering ratio of the etching rate was 3.0%.

Example 6

84.0 g of a 48% KOH aqueous solution (containing KOH in an amount corresponding to 0.72 moles therein), 198.7 g of a $K_2CO_3$ powder (corresponding to 1.44 moles of $K_2CO_3$), 500.0 g of a 20% by weight HA aqueous solution and 217.3 g of water were mixed to prepare 1,000 g of an etching liquid. A potassium ion concentration and a carbonate ion concentration in this etching liquid are calculated to be 3.6 moles/kg and 1.44 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.5 μm/min, $V_2$ was 3.4 μm/min, and a lowering ratio of the etching rate was 2.9%.

Example 7

91.0 g of a 48% KOH aqueous solution (containing KOH in an amount corresponding to 0.78 moles therein), 215.3 g of a $K_2CO_3$ powder (corresponding to 1.56 moles of $K_2CO_3$), 500.0 g of a 20% by weight HA aqueous solution and 193.7 g of water were mixed to prepare 1,000 g of an etching liquid. A potassium ion concentration and a carbonate ion concentration in this etching liquid are calculated to be 3.9 moles/kg and 1.56 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.7 μm/min, $V_2$ was 3.5 μm/min, and a lowering ratio of the etching rate was 5.4%.

Example 8

100.3 g of a 48% KOH aqueous solution (containing KOH in an amount corresponding to 0.86 moles therein), 237.4 g of a $K_2CO_3$ powder (corresponding to 1.72 moles of $K_2CO_3$), 500.0 g of a 20% by weight HA aqueous solution and 162.3 g of water were mixed to prepare 1,000 g of an etching liquid. A potassium ion concentration and a carbonate ion concentration in this etching liquid are calculated to be 4.3 moles/kg and 1.72 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.9 μm/min, $V_2$ was 3.7 μm/min, and a lowering ratio of the etching rate was 5.1%.

Example 9

294.0 g of a 48% KOH aqueous solution (containing KOH in an amount corresponding to 2.52 moles therein), 108.0 g of a potassium hydrogencarbonate ($KHCO_3$) powder (corresponding to 1.08 moles of $KHCO_3$), 500.0 g of a 20% by weight HA aqueous solution and 98.0 g of water were mixed to prepare 1,000 g of an etching liquid. A potassium ion concentration and a carbonate ion concentration in this etching liquid are calculated to be 3.6 moles/kg and 1.08 moles/ kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.1 μm/min, $V_2$ was 3.5 μm/min, and a lowering ratio of the etching rate was 14.6%.

Example 10

252.0 g of a 48% KOH aqueous solution (containing KOH in an amount corresponding to 2.16 moles therein), 144.0 g of a $KHCO_3$ powder (corresponding to 1.44 moles of $KHCO_3$), 500.0 g of a 20% by weight HA aqueous solution and 104.0 g of water were mixed to prepare 1,000 g of an etching liquid. A potassium ion concentration and a carbonate ion concentration in this etching liquid are calculated to be 3.6 moles/kg and 1.44 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.5 μm/min, $V_2$ was 3.4 μm/min, and a lowering ratio of the etching rate was 2.9%.

Example 11

420.0 g of a 48% KOH aqueous solution (containing KOH in an amount corresponding to 3.6 moles therein) and 500.0 g of a 20% by weight HA aqueous solution were mixed. 26.2 L (23° C., 1 atm.) of a $CO_2$ gas (corresponding to 1.08 moles of $CO_2$) was absorbed in this aqueous solution in a hermetically sealed system. Furthermore, 32.5 g of water was added thereto to prepare 1,000 g of an etching liquid. A potassium ion concentration and a carbonate ion concentration in this etching liquid are calculated to be 3.6 moles/kg and 1.08 moles/kg, respectively, and a molar ratio of the carbonate ion concentration to the potassium ion concentration is 0.30. An HA concentration in this etching liquid is 10% by weight, and a pH of this etching liquid is 14 or more.

A heat aging test was carried out using this etching liquid. As a result, $V_1$ was 4.1 μm/min, $V_2$ was 3.5 μm/min, and a lowering ratio of the etching rate was 14.6%.

Example 12

420.0 g of a 48% KOH aqueous solution (containing KOH in an amount corresponding to 3.6 moles therein) and 500.0 g of a 20% by weight HA aqueous solution were mixed. 35.0 L (23° C., 1 atm.) of a $CO_2$ gas (corresponding to 1.44 moles of $CO_2$) was absorbed in this aqueous solution in a hermetically sealed system. Furthermore, 16.6 g of water was added thereto to prepare 1,000 g of an etching liquid. A potassium ion concentration and a carbonate ion concentration in this etching liquid are calculated to be 3.6 moles/kg and 1.44 moles/kg, respectively, and a molar ratio of the carbonate ion concentration to the potassium ion concentration is 0.40. An HA concentration in this etching liquid is 10% by weight, and a pH of this etching liquid is 14 or more.

A heat aging test was carried out using this etching liquid. As a result, $V_1$ was 3.5 μm/min, $V_2$ was 3.4 μm/min, and a lowering ratio of the etching rate was 2.9%.

Comparative Example 5

420.0 g of a 48% KOH aqueous solution (containing KOH in an amount corresponding to 3.6 moles therein) and 500.0 g of a 20% by weight HA aqueous solution were mixed. 43.7 L (23° C., 1 atm.) of a $CO_2$ gas (corresponding to 1.80 moles of $CO_2$) was absorbed in this aqueous solution in a hermetically sealed system. Furthermore, 0.8 g of water was added thereto to prepare 1,000 g of an etching liquid. A potassium ion concentration and a carbonate ion concentration in this etching liquid are calculated to be 3.6 moles/kg and 1.8 moles/kg, respectively, and a molar ratio of the carbonate ion concentration to the potassium ion concentration is 0.50. An HA concentration in this etching liquid is 10% by weight, and a pH of this etching liquid is 11.9.

An etching treatment of silicon was carried out using this etching liquid. However, silicon was not dissolved, and the etching could not be achieved.

Example 13

288.0 g of a 20% sodium hydroxide (NaOH) aqueous solution (containing NaOH in an amount corresponding to 1.44 moles therein), 114.5 g of a sodium carbonate ($Na_2CO_3$) powder (corresponding to 1.08 moles of $Na_2CO_3$), 500.0 g of a 20% by weight hydroxylamine (HA) aqueous solution and 97.5 g of water were mixed to prepare 1,000 g of an etching liquid. A sodium ion concentration and a carbonate ion concentration in this etching liquid are calculated to be 3.6 moles/kg and 1.08 moles/kg, respectively, and a molar ratio of the carbonate ion concentration to the sodium ion concentration is 0.30. An HA concentration in this etching liquid is 10% by weight, and a pH of this etching liquid is 14 or more.

A heat aging test was carried out using this etching liquid. As a result, $V_1$ was 3.7 μm/min, $V_2$ was 3.2 μm/min, and a lowering ratio of the etching rate was 13.5%.

Example 14

504.0 g of a 20% NaOH aqueous solution (containing NaOH in an amount corresponding to 2.52 moles therein), 90.7 g of a sodium hydrogencarbonate ($NaHCO_3$) powder (corresponding to 1.08 moles of $NaHCO_3$), 250.0 g of a 40% by weight HA aqueous solution and 155.3 g of water were mixed to prepare 1,000 g of an etching liquid. A sodium ion concentration and a carbonate ion concentration in this etching liquid are calculated to be 3.6 moles/kg and 1.08 moles/kg, respectively, and a molar ratio of the carbonate ion concentration to the sodium ion concentration is 0.30. An HA concentration in this etching liquid is 10% by weight, and a pH of this etching liquid is 14 or more.

A heat aging test was carried out using this etching liquid. As a result, $V_1$ was 3.7 μm/min, $V_2$ was 3.2 μm/min, and a lowering ratio of the etching rate was 13.5%.

Example 15

720.0 g of a 20% NaOH aqueous solution (containing NaOH in an amount corresponding to 3.60 moles therein) and 200.0 g of a 50% by weight HA aqueous solution were mixed. 26.2 L (23° C., 1 atm.) of a $CO_2$ gas (corresponding to 1.08 moles of $CO_2$) was absorbed in this aqueous solution in a hermetically sealed system. Furthermore, 32.5 g of water was added thereto to prepare 1,000 g of an etching liquid. A sodium ion concentration and a carbonate ion concentration in this etching liquid are calculated to be 3.6 moles/kg and 1.08 moles/kg, respectively, and a molar ratio of the carbonate ion concentration to the sodium ion concentration is 0.30. An HA concentration in this etching liquid is 10% by weight, and a pH of this etching liquid is 14 or more.

A heat aging test was carried out using this etching liquid. As a result, $V_1$ was 3.7 μm/min, $V_2$ was 3.2 μm/min, and a lowering ratio of the etching rate was 13.5%.

Comparative Example 6

720.0 g of a 20% NaOH aqueous solution (containing NaOH in an amount corresponding to 3.60 moles therein), 200.0 g of a 50% by weight HA aqueous solution and 80.0 g of water were mixed to prepare 1,000 g of an etching liquid. A sodium ion concentration in this etching liquid is calculated to be 3.6 moles/kg; an HA concentration is 10% by weight; and a pH of this etching liquid is 14 or more.

A heat aging test was carried out using this etching liquid. As a result, $V_1$ was 3.5 μm/min, $V_2$ was 2.7 μm/min, and a lowering ratio of the etching rate was 22.9%.

It is understood from Examples 1 to 15 and Comparative Examples 1 to 6 that in a silicon etching liquid obtained by adding an inorganic carbonate compound in an aqueous solution containing an alkali metal hydroxide and hydroxylamine, when the etching liquid contains an alkali metal hydroxide, hydroxylamine and an inorganic carbonate compound and has a pH of 12 or more, the lowering of the silicon etching rate by a heat aging test is suppressed.

Also, in the silicon etching liquid according to the present invention, in view of the fact that it contains hydroxylamine, a very excellent etching rate as 3.3 (μm/min) or more is obtained in all of the Examples. In the present invention, even by somewhat scarifying a lowering of the etching rate, whether or not importance is attached to the etching rate, or whether or not importance is attached to smallness of a lowering ratio of the etching rate can be properly chosen depending upon an application.

The results of the Examples and Comparative Examples are shown in Table 1.

TABLE 1

| | Alkali metal hydroxide | Carbonate compound | Alkali metal ion concentration (mole/kg) | Carbonate ion concentration (mole/kg) | Molar ratio of carbonate ion to alkali metal ion | pH measured value of solution | Etching rate before heat aging treatment $V_1$ (μm/min) | Lowering ratio of etcing rate (%) |
|---|---|---|---|---|---|---|---|---|
| Example 1 | KOH | $K_2CO_3$ | 3.2 | 0.96 | 0.30 | 14 or more | 4.0 | 15.0 |
| Example 2 | KOH | $K_2CO_3$ | 3.6 | 1.08 | 0.30 | 14 or more | 4.1 | 14.6 |
| Example 3 | KOH | $K_2CO_3$ | 3.9 | 1.17 | 0.30 | 14 or more | 4.5 | 17.8 |
| Example 4 | KOH | $K_2CO_3$ | 4.3 | 1.29 | 0.30 | 14 or more | 4.8 | 18.8 |
| Example 5 | KOH | $K_2CO_3$ | 3.2 | 1.28 | 0.40 | 14 or more | 3.3 | 3.0 |
| Example 6 | KOH | $K_2CO_3$ | 3.6 | 1.44 | 0.40 | 14 or more | 3.5 | 2.9 |
| Example 7 | KOH | $K_2CO_3$ | 3.9 | 1.56 | 0.40 | 14 or more | 3.7 | 5.4 |
| Example 8 | KOH | $K_2CO_3$ | 4.3 | 1.72 | 0.40 | 14 or more | 3.9 | 5.1 |
| Example 9 | KOH | $KHCO_3$ | 3.6 | 1.08 | 0.30 | 14 or more | 4.1 | 14.6 |
| Example 10 | KOH | $KHCO_3$ | 3.6 | 1.44 | 0.40 | 14 or more | 3.5 | 2.9 |
| Example 11 | KOH | $CO_2$ | 3.6 | 1.08 | 0.30 | 14 or more | 4.1 | 14.6 |
| Example 12 | KOH | $CO_2$ | 3.6 | 1.44 | 0.40 | 14 or more | 3.5 | 2.9 |
| Example 13 | NaOH | $Na_2CO_3$ | 3.6 | 1.08 | 0.30 | 14 or more | 3.7 | 13.5 |
| Example 14 | NaOH | $NaHCO_3$ | 3.6 | 1.08 | 0.30 | 14 or more | 3.7 | 13.5 |
| Example 15 | NaOH | $CO_2$ | 3.6 | 1.08 | 0.30 | 14 or more | 3.7 | 13.5 |
| Comparative Example 1 | KOH | — | 3.2 | 0.00 | 0.00 | 14 or more | 3.6 | 22.2 |
| Comparative Example 2 | KOH | — | 3.6 | 0.00 | 0.00 | 14 or more | 3.9 | 23.1 |
| Comparative Example 3 | KOH | — | 3.9 | 0.00 | 0.00 | 14 or more | 4.3 | 27.9 |
| Comparative Example 4 | KOH | — | 4.3 | 0.00 | 0.00 | 14 or more | 4.4 | 27.3 |
| Comparative Example 5 | KOH | $CO_2$ | 3.6 | 1.80 | 0.50 | 11.9 | — | Calculation impossible*[1] |
| Comparative Example 6 | NaOH | — | 3.6 | 0.00 | 0.00 | 14 or more | 3.5 | 22.9 |

Immersion temperature: 80° C.
Immersion time: 10 minutes
KOH: Potassium hydroxide
$K_2CO_3$: Potassium carbonate
$KHCO_3$: Potassium hydrogencarbonate
$CO_2$: Carbon dioxide
NaOH: Sodium hydroxide
$Na_2CO_3$: Sodium carbonate
$NaHCO_3$: Sodium hydrogencarbonate
*[1]Since the etching rate ($V_1$) before the heat aging treatment is a detection limit (0.1 μm/min) or less, it is impossible to calculate the lowering ratio of the etching rate.

INDUSTRIAL APPLICABILITY

According to the silicon etching liquid and the silicon etching method of the present invention, complicated operations such as frequent processing shape confirmation in realizing a long life of the hydroxylamine-containing silicon etching liquid and performing an etching treatment, and the like can be greatly simplified. Utilizing this effect, the silicon etching liquid and the silicon etching method of the present invention can be suitably used for manufacturing parts or semiconductor devices which are used for micromachines.

The invention claimed is:
1. An alkaline aqueous solution comprising:
water;
(A) an alkali metal hydroxide;
(B) hydroxylamine; and
(C) an inorganic carbonate compound, wherein the alkaline aqueous solution has a pH of 12 or more;
a concentration of an alkali metal ion generated in the aqueous solution upon dissociation of the alkali metal hydroxide (A) and the inorganic carbonate compound (C) is from 3.0 moles/kg to 4.5 moles/kg; and
a concentration of a carbonate ion ($CO_3^{2-}$) generated in the aqueous solution upon dissociation of the inorganic carbonate compound (C) is from 0.28 to 0.42 in terms of a molar ratio to the concentration of the alkali metal ion.

2. The alkaline aqueous solution according to claim 1, wherein the alkali metal hydroxide (A) is a potassium hydroxide.

3. The alkaline aqueous solution according to claim 1, wherein the inorganic carbonate compound (C) is a compound capable of being dissociated in the alkaline aqueous solution to generate a carbonate ion ($CO_3^{2-}$).

4. The alkaline aqueous solution according to claim 1, wherein the inorganic carbonate compound (C) is one or more members selected from the group consisting of a carbon dioxide ($CO_2$), a potassium carbonate ($K_2CO_3$), a potassium hydrogencarbonate ($KHCO_3$), a sodium carbonate ($Na_2CO_3$) and a sodium hydrogencarbonate ($NaHCO_3$).

5. The alkaline aqueous solution according to claim 1, wherein the alkali metal ion is a potassium ion ($K^+$).

6. The alkaline aqueous solution according to claim 1, having a pH of 13 or more.

7. A silicon etching method, the method comprising:
contacting an etching object with a silicon etching liquid, wherein the silicon etching liquid comprises
water,
(A) an alkali metal hydroxide,
(B) hydroxylamine, and
(C) an inorganic carbonate compound, and
the silicon etching liquid has a pH of 12 or more,
wherein a concentration of an alkali metal ion generated in the aqueous solution upon dissociation of the alkali metal hydroxide (A) and the inorganic carbonate compound (C) is from 3.0 moles/kg to 4.5 moles/kg; and
a concentration of a carbonate ion ($CO_3^{2-}$) generated in the aqueous solution upon dissociation of the inorganic carbonate compound (C) is from 0.28 to 0.42 in terms of a molar ratio to the concentration of the alkali metal ion.

8. The silicon etching method according to claim 7, wherein
the alkali metal hydroxide (A) is potassium hydroxide or sodium hydroxide; and
the inorganic carbonate compound (C) is one or more members selected from the group consisting of a carbon dioxide ($CO_2$), a potassium carbonate ($K_2CO_3$), a potassium hydrogencarbonate ($KHCO_3$), a sodium carbonate ($Na_2CO_3$) and a sodium hydrogencarbonate ($NaHCO_3$).

9. The alkaline aqueous solution according to claim 1, wherein the alkali metal hydroxide (A) is a sodium hydroxide.

10. The alkaline aqueous solution according to claim 1, wherein the alkali metal ion is a sodium ion ($Na^+$).

11. A silicon etching method, the method comprising:
contacting an etching object with a silicon etching liquid, wherein the silicon etching liquid comprises
water,
(A) an alkali metal hydroxide,
(B) hydroxylamine, and
(C) an inorganic carbonate compound, and
the silicon etching liquid has a pH of 12 or more.

12. The alkaline aqueous solution according to claim 1, wherein the alkali metal hydroxide is selected from the group consisting of KOH and NaOH;
the organic carbonate compound is at least one selected from the group consisting of $K_2CO_3$, $KHCO_3$, $Na_2CO_3$ and $NaHCO_3$;
the concentration of the alkali metal ion generated upon disassociation of the alkali metal hydroxide (A) and the inorganic carbonate compound (C) is from 3.2 moles/kg to 4.3 moles/kg; and
the molar ratio of the concentration of the alkali metal ion is from 0.30 to 0.40.

13. The alkaline aqueous solution according to claim 1, wherein the inorganic carbonate compound is selected from the group consisting of $K_2CO_3$, $KHCO_3$, $Na_2CO_3$ and $NaHCO_3$.

14. The alkaline aqueous solution according to claim 1 having a carbonate ion concentration of 0.96 mol/kg to 1.72 mol/kg.

15. The alkaline aqueous solution according to claim 1 having a pH of 13 or more.

16. The silicon etching method according to claim 7, wherein the alkali metal hydroxide is selected from the group consisting of KOH and NaOH;
the organic carbonate compound is at least one selected from the group consisting of $K_2CO_3$, $KHCO_3$, $Na_2CO_3$ and $NaHCO_3$;
the concentration of the alkali metal ion generated upon disassociation of the alkali metal hydroxide (A) and the inorganic carbonate compound (C) is from 3.2 moles/kg to 4.3 moles/kg; and
the molar ratio of the concentration of the alkali metal ion is from 0.30 to 0.40.

17. The silicon etching method according to claim 7, wherein the inorganic carbonate compound is selected from the group consisting of $K_2CO_3$, $KHCO_3$, $Na_2CO_3$ and $NaHCO_3$.

18. The silicon etching method according to claim 7 having a carbonate ion concentration of 0.96 mole/kg to 1.72 mole/kg.

* * * * *